United States Patent [19]
Gupta

[11] Patent Number: 5,349,535
[45] Date of Patent: Sep. 20, 1994

[54] BATTERY CONDITION MONITORING AND RECORDING SYSTEM FOR ELECTRIC VEHICLES

[75] Inventor: Om P. Gupta, Ithaca, N.Y.

[73] Assignee: Digicomp Research Corporation, Ithaca, N.Y.

[21] Appl. No.: 963,997

[22] Filed: Oct. 20, 1992

[51] Int. Cl.$^5$ .............................. G08B 21/00; H02J 7/00
[52] U.S. Cl. ........................ 364/483; 364/550; 364/551.01; 320/2; 320/48
[58] Field of Search ............... 364/483, 550, 551.01; 320/6, 3, 15, 8, 20, 40, 48

[56] References Cited

U.S. PATENT DOCUMENTS

| | | | |
|---|---|---|---|
| 4,309,644 | 1/1982 | Reimers et al. | 318/139 |
| 4,383,210 | 5/1983 | Wilkinson | 320/2 |
| 4,532,418 | 7/1985 | Meese et al. | 320/2 |
| 4,564,798 | 1/1986 | Young | 320/6 |
| 4,961,043 | 10/1990 | Koenck | 320/21 |
| 5,047,961 | 9/1991 | Simonsen | 364/550 |
| 5,121,044 | 7/1992 | Goldman | 320/2 |
| 5,184,058 | 2/1993 | Hesse et al. | 320/4 |
| 5,200,689 | 4/1993 | Interiano et al. | 320/20 |
| 5,202,617 | 4/1993 | Nor | 320/2 |

OTHER PUBLICATIONS

E. M. Mroteck and P. J. Gurlusky, "A generic battery model for electric and hybrid vehicle simulation performance prediction", Int. J. of Vehicle Design, 1982, pp. 125-143.
Mahato et al, "Performance Testing of Advance Lead-Acid Batteries for Electric Vehicles", Journal of Power Sources, 16 (1985) pp. 107-118.
Ralph Stern, "The Treasury of the Automobile", Golden Press 1961, 1 page.
David Hebb, "Wheels on the Road", Collier Books, N.Y. 1966.
Ralph Stgn, "The American Automobile", Random House, N.Y.
Sheldon Shaerett, "Complete Book of Electric Vehicles" Davis Books, N.Y., 1979, pp. 84, 89 and 157.

Primary Examiner—Thomas G. Black
Assistant Examiner—Tan Q. Nguyen
Attorney, Agent, or Firm—Barnard, Brown & Michaels

[57] ABSTRACT

A device for accumulating information about storage batteries, especially useful for electric vehicles, in which a microcomputer having memory and associated sensors is built into each battery pack. The device accumulates data about the usage and condition of the pack, and identification data on the user, then transmits the data to an external computer when the pack is charging.

21 Claims, 3 Drawing Sheets

BATTERY CONDITION MONITORING AND RECORDING SYSTEM FOR ELECTRIC VEHICLES

FIELD OF THE INVENTION

The invention pertains to the field of devices for monitoring the condition of a battery. More particularly, the invention pertains to systems for acquiring and storing information about the usage and condition of a battery or battery pack over time, especially applicable to the field of battery packs for electric vehicles.

BACKGROUND OF THE INVENTION

It should be understood that in this explanation the term "battery pack" will usually refer to a collection of batteries (often 10–12 or more) usually connected in series and used to power an electric vehicle. "Battery" will be usually be used to refer to individual batteries. Colloquially, "battery" and "battery pack" are often used interchangeably in the electric vehicle field. Each "battery" is usually made up of a collection of individual "cells" within one case.

Electric vehicles have been manufactured for many years. In fact, in the very earliest days of automobiles, around the turn of this century, electric power was an equal contender with steam and internal combustion. From about the time of the First World War, however, the convenience, speed and economy of the internal combustion engine all but eliminated electric cars as a factor in the market. At the time of the gas crisis in the mid- to late- 1970's, electric cars were again in the limelight, but most of the companies then in the market faded away with the abundant gasoline and lessened government subsidies of the 80's.

Now, air pollution reduction laws have forced several states (such as California) to require that a certain percentage of cars sold be "zero pollution"—which means, in today's technology, electric.

The major drawback to electric cars which resulted in the death of the industry in the 1920's is the same one which has retarded the use of such vehicles to this day, except in very specialized applications. That drawback is the very nature of the lead-acid storage battery: weight, cost, limited lifetime, and, most of all in today's mobile society, the limited vehicle range between recharges and the time consumed by such recharging. It would be typical of modern electrics to need a charge of six or eight hours duration after less than 100 miles of relatively low-speed cruise. While adequate for a delivery truck making local deliveries with overnight charging, perhaps, such range is too short, and the recharge time too long, to attempt to use such a vehicle on even a relatively short highway trip.

Several exotic alternatives have been proposed, such as fuel cells and high-temperature sodium batteries, etc, but cost and safety factors will most likely cause the old familiar lead-acid battery in one form or another to remain the standard for some time to come.

This has led to attempts to develop improvements in battery chargers, or in the batteries, to shorten the recharge time of the battery pack to something similar to the refill time of a gas tank on today's car. Some promoters have claimed recharge times of as short as five minutes in the popular press, but a simple calculation will show that any attempt to put the energy involved in moving a vehicle 100 miles or more back into a battery pack in such a short time would involve charging currents on the order of several thousands of amperes. This would require cables and connectors of gargantuan size, and such a charge current would melt most current battery packs, not to mention the peak demand on the electric power system of a highway "gas station" charging eight or ten cars at such a rate.

One possible solution to the problem is not to recharge the battery at all—at least, not while the driver waits. Instead, one simply removes the battery pack and replaces it with a new pack, fully charged. The removed pack can then be recharged at leisure.

This elegant approach was, in fact, used commercially with the first auto taxis in New York City. There were hundreds of Columbia Electrics on the streets of New York in about 1900. When the battery pack began to run down, the cab was driven back to its garage, where the nearly a ton of battery was removed by a hydraulic lift, and a freshly-charged pack was lifted into place. (See *The Treasury of the Automobile*, Stein, 1961, p. 102; *Wheels on the Road*, Hebb, 1966, p. 71). Some of the electrics designed and marketed in the late 70's, like their remote ancestors, included provision for swapping battery packs (see *Complete Book of Electric Vehicles*, Shackett, 1979, pp. 84,89). In these latter-day electrics, as in the Columbias of 1900, the owner of the vehicles would have to maintain a number of sets of batteries, and appropriate lifts, to keep its fleet on the road. Because of this, the only application of swappable battery packs on electric vehicles, insofar as there has been any use of the technique at all, has been in large fleets of cabs or delivery trucks where the owner can amortize the cost of extra batteries and whatever is necessary to change them over many vehicles, or where the need to keep the vehicle constantly on the road (as in the cabs) is enough to justify the expense. For the individual electric car, to date, this has made the swappable battery pack economically prohibitive.

Once a certain minimum number of electric cars are on the road, however, whether mandated by law due to pollution laws or as a response to gasoline shortages or price, and if electric auto manufacturers agree on standardized battery packs, it would become practical for someone other than the vehicle owner to make the investment in the cost of battery packs, chargers and changing machinery. One can envision, then, a national chain of battery "gas stations" where electric car drivers can pull off the highway, drop off a depleted battery pack and install a freshly charged one, and be on their way in a matter of minutes. With such a "swappable battery" system the problems of limited range, long recharge time, and limited battery life become irrelevant.

The battery station dealer would, at a later time, charge the dropped-off battery pack at a reasonable charge rate and get it ready for the next customer. Once a pack had reached the end of its life the dealer could retire it and replace it in the stream of packs. This, then, gives rise to cost allocation issues requiring the tracking of the pack, its location and usage, which are addressed by the subject invention.

Another factor which has held back the acceptance of the electric car for the average driver is the limited life of the batteries themselves. Lead-acid batteries typically lose their ability to be fully charged and to retain their charge with age and also with the rate of charge and discharge to which they are exposed. The typical life of a practical electric vehicle traction battery should be approximately 850 recharging cycles from the fully discharged state, which would vary based upon the way the vehicle is driven. (See Chapman and Aston, "A Generic Battery Model for Electric and Hybrid Vehicle Simulation Performance Prediction", *Int. Journal of Vehicle Design, Special Publication SP2*, London, UK (1982), pp. 125–143; Mahato, Brilmeyer and Bullock, "Performance Testing of Advanced Lead-Acid Batteries for Electric Vehicles", *Journal of Power Sources*, v. 16 pp. 107–118 (1985)). This implies that the vehicle owner should not expect his traction battery, after several hundred recharges, would still give him the driving-mileage potential of a new battery. More important, from the driver's standpoint, the "fuel gauge" of the vehicle should be able to reflect this age deterioration. Further, this reduction of capacity with age currently means that the electric vehicle owner must be ready to replace the entire battery pack every 850 cycles or so—about every 3–4 years for a car used every weekday—a major expense to be considered in purchasing an electric car.

This problem of limited battery life and high replacement cost can be circumvented with the conventional (i.e. not swappable) battery packs by separating the ownership of the car and the battery, and having the car owner lease the batteries from either the car manufacturer or some third party, such as a battery manufacturer. Possibly in the future electric cars will be sold without batteries, and the purchaser will have the option of buying or leasing the pack from a number of sources. If this scenario develops, the owner of the batteries will need to keep track of the usage of the pack, for the same reasons as discussed for swappable packs.

An individual customer might be offered a number of optional methods of paying for the battery pack based on his own usage patterns, whether in a conventional system with leased batteries, or in a swappable pack system. The customer could pay a flat annual "rental" fee on the packs, or he could be billed periodically based on the amount of the battery pack's "life" he had "used up" in his driving. This latter method would take into account the factor that battery life is affected by how it is used—a driver who draws heavy current from the battery by high speeds or rapid acceleration and drains the pack nearly dry before recharging would pay more than a driver who uses only small currents in short, low speed city trips. In addition, a "usage" fee could be assessed based on the amount of energy consumed, or the amount of energy used by the dealer in charging the battery.

Accumulation of usage history for the battery pack would also allow a more accurate "on the fly" estimation of remaining range—an important factor for the driver.

In addition, most car owners and drivers do not keep very good statistics about the use of their vehicles. The accumulation of usage history information is of importance to the car owner/driver for the purpose of tracking maintenance intervals and time to replace the pack, and to monitor and perhaps give warning of pack deterioration.

The customer might recharge the battery pack at home overnight, as well. If such recharging is done, and it would seem that in many applications it would be desirable, the battery supplier would need to take this into account when billing and accounting for the health and usage history (rate and number of charge/discharge cycles) of the pack.

If the swappable system were to be adopted, the battery pack dealer would most often see the pack at recharging time, perhaps after it has been removed from the vehicle. In such a case it would be necessary for the dealer to be able to identify the last user of the pack once it has been removed.

It is also possible that, if the electric car should become a significant portion of the cars on the road, that either municipal or private parking lots might find it advantageous to provide charging facilities at some or all of the parking spots in a lot by providing charging posts very similar to parking meters. If they were to do so, there would need to be some mechanism for having the driver pay for the energy consumed. While a simple coin-operated mechanism might work, or a credit card reader, it would be better if the car owner were simply billed for the energy as part of his periodic battery bill with no more effort than simply plugging the battery pack into a charging socket.

It is thus the object of this invention to provide a device for implementing a method of gathering information on battery charge and usage, which is associated with the battery pack, and is independent of the car electronics. Such information can then be used in a system of billing for pack usage and/or energy consumption, as well as optionally providing for an accurate running estimate of remaining charge and/or battery life for the driver of the vehicle.

The prior art, as explained above, does not, to the inventor's knowledge, describe any such device in any traction battery system, whether for a swappable "battery swap" system, or for the more conventional fixed pack approach. The reason for this is simple—in all of the cases of replaceable traction batteries for electric vehicles known to the inventor, there was no need to track individual packs or vehicles, or to bill usage, since all of the vehicles and packs were owned by a single fleet. In conventional systems, the battery pack has always been owned by the vehicle owner, again, primarily in fleets. Although there might be some usefulness in the invention to a fleet operation (especially in third-party battery leases), the invention is primarily directed to a market which has not hitherto existed—the rental of battery packs to individual vehicles, where the ownership of the batteries is in an entity other than the car owner. The invention also has applicability to battery pack usage outside of the vehicle field, such as remote transmitters, backup power, etc.

Some method will need to be set up to allow national or regional usage of electric vehicles. If the battery swap system does not evolve, some sort of central billing for recharging services will have to be developed. An electric car owner will want to be able to plug into a standardized charging station anywhere in a wide geographic area, and be able to receive a bill later, in the same way as he receives gasoline credit card bills today. The owner of the battery pack will want some method of accumulating the statistics about the usage of the pack, so that he can notify the car owner when the pack has aged to the point where it is necessary to change the pack.

If the swap system is developed, it will need to become broadbased. Few electric vehicle users will want to be limited to a single local battery replacement center. It may happen that more than one company may arise to supply the roadside replacement or recharge service, and a user will swap packs only at stations belonging to the company with which he has a contract.

Alternatively, a national franchise concern might be implemented, with local ownership of replacement centers, who will share battery packs belonging to the franchiser among the franchise (perhaps like today's one-way rental trucks). Or the batteries may circulate freely among many unrelated vendors, with accounting handled through a central clearing house, somewhat analogous to the system used for railway boxcars. By keeping information about the identity of the pack, and the history of the users, the invention will facilitate the implementation of whatever system should evolve.

SUMMARY OF THE INVENTION

The invention uses a microprocessor and associated electronics, sensors and memory to identify and accumulate statistics about the use of a battery pack. The system is associated with a specific battery pack, and can be either built into one or more (perhaps all) of the batteries, or attached to the pack.

Input data can include, but is not limited to, charge and discharge rate (i.e. currents), battery electrolyte specific gravity (an indicator of charge level), ambient and/or cell temperature, battery voltage, vehicle or user ID, or statistical data on the specific type of pack. The monitor could provide long-term storage for historical information about the pack, such as number of charge-discharge cycles, rates of charge/discharge for each cycle, lowest discharge, amount of energy delivered per charge, etc.

The information accumulated is communicated to an external computer or network to be used to bill users of the pack, track pack characteristics and energy usage, estimate remaining pack life, provide a warning of "sick" or abused packs, and to provide the vehicle driver with an indication of remaining range ("gas gauge").

DESCRIPTION OF THE PREFERRED EMBODIMENT

Figure 1:
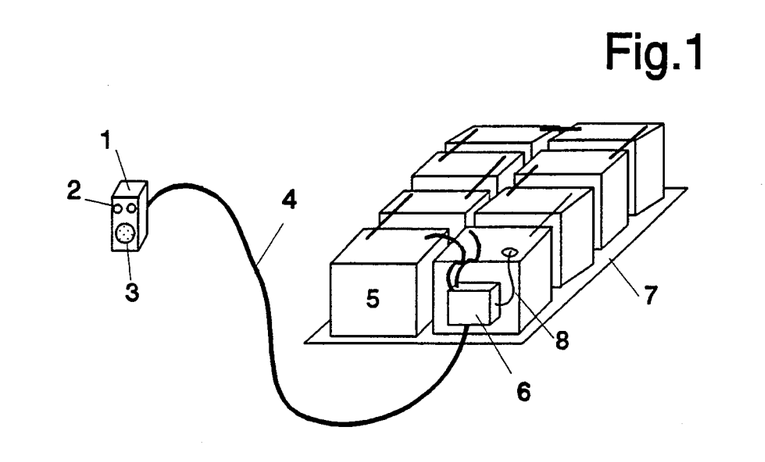
FIG. 1 shows the invention as built into a battery pack for an electric vehicle.

FIG. 1 shows the invention (6), as attached to a replaceable battery pack for use in electric vehicles. The pack is made up of a collection of individual batteries (5), as many as needed to make up the voltage required by the vehicle.

The invention (6) is preferably permanently attached to one of the batteries in the pack. "Permanently", in this context, means "for the useful life of the battery pack." Once the pack is broken up or retired, the invention can then be moved to another pack. In an alternative embodiment, the invention could be associated with and affixed to a battery, rather than a pack, with one of the devices for every battery in the pack. This is not necessary, however, as it can be safely assumed that the usage of the pack can be dealt with in the aggregate.

If information about each of the batteries in the pack is needed, an alternate embodiment would allow for individual measurements from more than one battery to become inputs into a single device according to the teachings of the invention, without the need for multiple copies of the invention.

Although the preferred embodiment is described in terms of a swappable pack suitable for use in the battery-swap system described above, it will be understood by one skilled in the art that the invention will work in exactly the same way in a more conventional non-swappable battery system.

In the preferred embodiment, as described for a battery-swap type environment, one cable (4) leads from the pack to a single connector (1) which plugs into the vehicle or charging station, although any convenient arrangement, such as individual connectors for charging station and vehicle, might be used. The use of a single connector facilitates easy replacement of packs, and makes it more difficult to bypass the system. This same method of interconnection might be appropriate for the conventional non-swappable pack, too, as it is currently common in electric vehicles for the user to unplug the battery pack from the vehicle and plug it into a charger.

It is expected that the industry will standardize on some method of interconnection of the pack and the invention to the vehicle and charging station, and the exact method used does not form a part of the invention.

The connector shown has large pins (2) for the high-amperage traction current, and a plurality of smaller pins (3) for data and measurements, as explained in more detail in the following figures. Signals may be routed to the invention through sensors and wires (8) connected to or inserted into one or more of the batteries in the pack. Alternatively, the data signals might be "piggybacked" onto the large pins using carrier current or the like.

Figure 2:
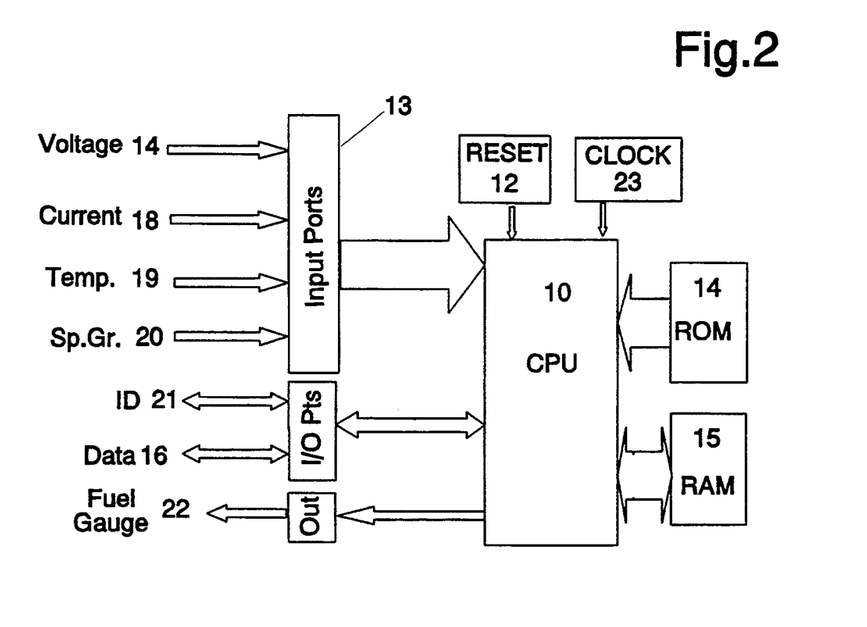
FIG. 2 shows a block diagram of the invention, with internal details and input/output ports.

The device of the invention (6) comprises a computer controlled sampling and data-collection/communication system which measures battery, pack, and ambient conditions, and communicates with the vehicle or charging station to which the pack is connected.

The heart of the device is a Central Processing Unit (CPU) (10) which can be any of the generally available microprocessor "chips", or some other equivalent which might be developed later. In today's technology, the preferred embodiment would use a low-power drain CMOS eight- or sixteen-bit microprocessor, such as the Intel 80C88 or equivalent. Alternatively, all of the circuitry of the invention could be integrated into one or more Large Scale Integration (LSI) chips, or even built of discrete components, as the designer might desire.

The program for the microprocessor (10) would reside in Read Only Memory (ROM) (14), or, alternatively, in some other non-volatile memory, so that the device will not lose its programming if the supply voltage is removed. The programming could be written in whatever language is native to the processor chosen, or in some higher-level language, in any way the technology of the day permits to one skilled in the art. The programming can be changed as standards and capabilities vary over time, to provide the flexibility to allow a pack equipped with the invention to interface with the changing vehicle market. One skilled in the art could select the ROM from the many available on the market today, or which will be developed later, which will interface to the CPU.

The data gathered by the invention is stored in non-volatile Random Access Memory (RAM) (15). The memory must be non-volatile, in order to hold the data when the supply voltage is removed, or becomes too low through pack depletion to keep the system operating. The exact type of non-volatile memory is not important, and one skilled in the art could select from many types now available, or which will later become available. In today's technology, a non-volatile RAM such as the X2004 chip from Xicor would be a preferred choice. Alternatively, one could select RAM backed up by a battery, EEPROM, bubble memory, or even a disk drive, within the teachings of the invention.

A reset circuit (12) is preferably provided to turn the invention off when the supply voltage drops below a minimum value, and starts the system up again from where it left off when the battery has sufficient charge again. Since the invention is preferably implemented in low-power circuitry, the reset voltage would be set far below the expected operating voltages of the pack, below which the pack is essentially dead and the vehicle inoperative anyway. Information gathered below this limit would be essentially meaningless, anyway. As an example, a typical pack might comprise 16 6-volt batteries, for a total of 96 volts. The typical supply voltage for a regulated supply for CMOS circuitry would need, say, 8-10 volts or less. By the time the pack had dropped that far it is safe to say that it would be acceptable to shut down the system of the invention, because the car would not be going much further.

The invention will preferably have a real-time (calendar) clock (23) which can supply time-and-date information to the computer, so that the historical data being stored can be time stamped. This will permit analysis of the changes in battery characteristics and charge/discharge cycles over time, and other useful parameters.

The invention samples its "world" through a plurality of Input (13) ports. One or, preferably, many signals indicative of battery condition and/or use will be input to the invention through the Input ports. These signals would be derived from sensors measuring such parameters as battery voltage (17), current into (charging) or out of (vehicle operation) the pack (18), ambient or cell temperature (19), and possibly even specific gravity of the electrolyte (20) in one or more of the cells of one or more of the batteries of the pack (specific gravity is a measure of the charge status of a cell).

Each of these parameters can be used in determining cell charge state, usage and remaining life. For example, lead-acid batteries lose much of their capacity when their temperature drops below 0° C., so the ambient temperature or cell temperature becomes very important in estimating range. The internal resistance of the battery cause greater losses when the cells are charged or discharged at higher currents than at lower currents, so that an estimate of energy input or output needs to be revised based on the rate of energy intake or withdrawal. Further, the heat or outgassing caused by extremely high charge or discharge rates can damage batteries, or at the very least shorten their lives, which would be very important information for the battery owner to know. The instantaneous charge state can be determined from the specific gravity of the electrolyte. If the voltage is measured across each cell, or across each battery in the pack, the invention could give a warning of the presence of weak or dead cells.

The exact nature of these ports can vary widely within the teaching of the invention, and could be easily designed by one skilled in the design of computer systems from the specifications of the specific computer selected. The inputs could be analog or digital, whatever suits the design of the system and the standards chosen by the industry. Since the preferred embodiment of the invention is intended for use in traction battery packs in an electric vehicle environment, it is anticipated that at least some of the exact signals supplied will be specified, perhaps in several alternative forms of differing complexity, by the industry itself. The designer would then be faced with choosing whatever method the art presents to design the Input ports to adapt the specified signal to the CPU chosen. In some applications, the Input ports could be bidirectional (I/O) ports, to interrogate sensors digitally.

The Input ports will preferably be connected to sensors in or connected to a cell or a plurality of the cells or batteries in the pack. It will be understood by one skilled in the art that one can choose to measure different quantities, and still conform to a standard connection to a vehicle and charging station, as further explained below. The data collected and produced could be set up in a hierarchy of complexities within a standard, depending upon the wishes of the pack owner and/or operator.

These sensors measuring the various input parameters noted above might all be present, or the designer might choose within the teachings of the invention to omit one or more of them. Or, the designer might choose to measure the same quantity in more than one place (for example, to sample the voltage of each battery in a pack, or the specific gravity in each cell in each battery, to determine the health of each battery, rather than the pack as a whole). Future battery developments might lead to other measurements which might be included within the teachings of the invention.

A specialized input/output port to the preferred embodiment of the invention is one for identifying the user of the pack, or Vehicle ID (21). Preferably, this port would be bidirectional, so that the invention could interrogate the vehicle periodically, or when first inserted, and receive an identification signal back. The ID could be built into the vehicle in the form of a ROM in the connection with the pack, or could be "uploaded" into the vehicle as part of signing up with a service company. The exact nature of this would be defined by the standard adopted, but some form of identification would be needed so that the invention could then report the information to the charging station for billing purposes. Again, this would be equally important in a non-swappable system, for billing purposes, even though the vehicle ID would not change over long periods of time.

The invention preferably includes at least one output port (22) for communicating with the vehicle operator in the form of a battery condition indicator. It is expected that some form of condition indicator would be incorporated into the standard vehicle interface, and the standard chosen would determine the nature of this output within the teachings of the invention. This output could be as simple as an analog voltage to drive a "gas gauge" or as complex as a digital line supplying predictions of remaining pack life or percentage of charge remaining, or might even include both outputs, to accommodate differing cars. Perhaps the standard could include an analog "gas gauge" output for simpler cars, and use a digital interface for more expensive versions with digital readouts.

The invention will communicate with the "outside world" through a data input/output (I/O) port (16). This could be any kind of bidirectional port known to the art, serial or parallel, as will be defined in the industry standard to be developed. In the current state of the art, it would preferably a IEEE RS-232 serial port running at some convenient baud rate. This port could be combined with, or supplement, the battery condition output (22) and vehicle ID (21) discussed above. The same data I/O port would preferably be used to communicate with the vehicle, when the pack is inserted in a car, and with the charging station, when it is removed or plugged in for charging.

Figure 3:
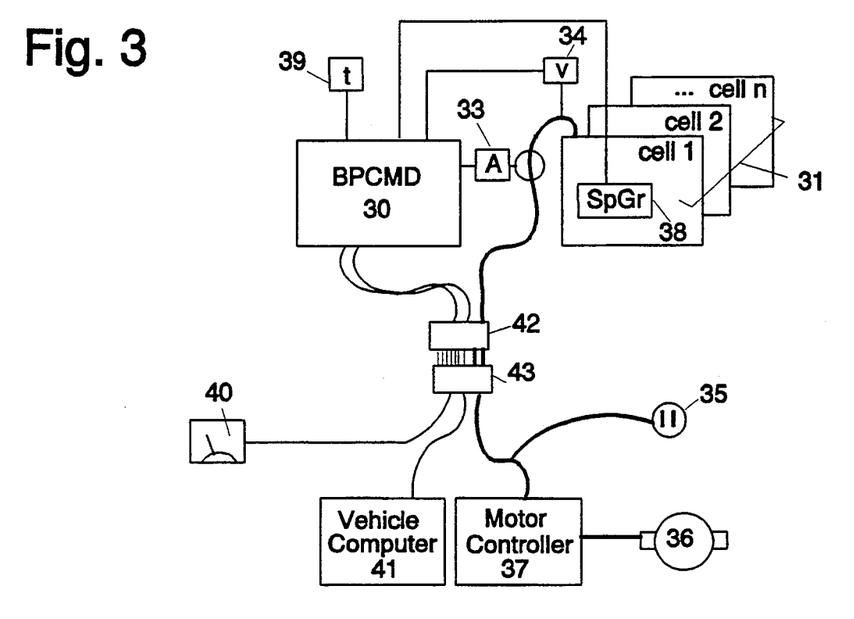
FIG. 3 shows a block diagram of the invention as it interconnects with the battery pack, with external connections to a vehicle.

FIG. 3 shows the flow of signals and information in the preferred embodiment of the invention (30) when its associated pack (31) is operating in a vehicle. The traction power is routed to a controller (37) which controls the vehicle motor (36) in any way known to the art. A charging receptacle (35) will most likely be built into the vehicle to allow in-vehicle charging of the pack between swaps, or the pack connector (42) could simply be unplugged and plugged into the charging station.

When the pack (31) is inserted into the vehicle, and the standardized connector (42) plugged into the mating connector on the vehicle (43), the invention sends an interrogation signal to ascertain the identity of the vehicle. In FIG. 3, this is shown as a signal sent through the smaller pins of the connectors (42, 43) to the vehicle microcomputer (41) which responds with a data stream indicating the vehicle ID. The invention could do this interrogation continuously (indicating to the vehicle that the invention was installed and operating), or on a periodic basis, or when the pack is first plugged into the vehicle, or when the invention first detects current drain indicating usage. The CPU stores this vehicle ID in the non-volatile memory, for use in billing the subsequent usage to the correct customer.

As the pack is used, the invention monitors a number of parameters. The preferred embodiment shown in the figure has sensors for pack voltage (34), current (33) into (−) or out of (+) the pack, specific gravity within the battery (38) and ambient temperature (39). These sensors are sampled periodically by the invention, and the resulting data is stored in the non-volatile memory.

In its simplest form, the invention could record power drained from the pack by the vehicle (defined as a negative value of current times the pack voltage) and power put back into the pack from the charger or from regenerative braking (defined as a positive value of current times the pack voltage), and combine the two to come up with a rough indication of remaining pack capacity. This will be preferably displayed on a "gas gauge" display (40). Integrating the energy flows in and out of the battery over time will allow the invention to automatically account for charge added by the driver (i.e. while the pack is in the vehicle) and distinguish it from charge added by the dealer (i.e. while the pack is plugged into a charging station) for billing purposes.

It is preferable, however, for the invention to combine the many parameters available to derive a more accurate measure of remaining charge and pack life. This can be done using any one of many statistical methods known to the art. For example, battery capacity is affected strongly by ambient temperature—a pack at below freezing loses much of its capacity or more—so that the temperature sensor data would be used to reduce range proportionately using formulas well known to one skilled in the art. Range and pack life is also affected by the rate of energy withdrawal—the faster the charge is removed (i.e. the higher the current) the shorter the battery life. The specific gravity sensor could be used to sense charge state directly. This specific-gravity derived charge state could be compared with the predicted charge state based on energy flows and temperature, and further compared with historical data as the pack ages, to allow the invention to develop a measure of battery condition and remaining life.

In its preferred embodiment, the invention would go beyond storing mere "gas gauge" type data to storing specific history of pack usage—records of each charge/discharge cycle, including times, rates and amounts of energy withdrawn and added, peak charge and discharge currents, and other pertinent data. This data could later be downloaded to the remote system for analysis, tracking of pack usage and life, warning of abuses, and other purposes.

Figure 4:
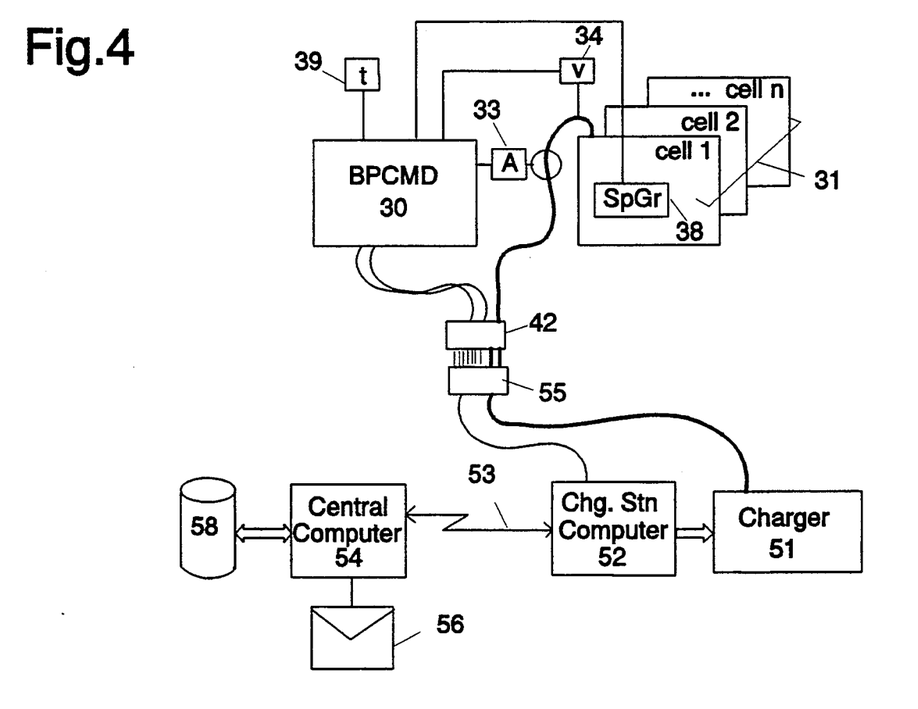
FIG. 4 shows a block diagram of the invention as it interconnects with the battery pack, with external connections to a charging/billing station.

FIG. 4 shows the pack (31) after it has been plugged into a charging station. In the swappable battery pack system, the pack will have been removed from the vehicle. In the conventional, non-swappable system, the battery pack remains in the vehicle during charging. Reference numbers 31 through 42 are the same as in FIG. 3, since they are part of the pack and travel with it.

Once plugged into the charging station with its mating plug (55), the invention will dump some or all of its accumulated information into the charging station computer (52), which will preferably be connected via telecommunications link (53) (real time or batch) to a central computer (54) used for billing and tracking the packs. Some or all of the data would be stored on mass storage (58) there, and later used to print out bills (56).

The central computer (54) may use the user ID information downloaded from the system of the invention to check its storage (58) to ensure that the user is eligible to charge his battery at the charging station. In such an application, the charge station will wait for this verification before enabling the battery charger (51). This will allow the system to deny charging to a lapsed account, or even to a stolen vehicle.

At a minimum, the invention would download the identity of the last vehicle(s) in which the pack was installed. In its simplest form, this would suffice to bill the user for the time the pack was in his car, if the billing arrangement worked that way. Alternatively, the invention could download the net energy used (pack drain less charge input while on the car) if the billing is to be based on energy used. Or, the invention could use the same sensors (33, 34, 38 and 39) to track the energy put back into the pack by the charger (51) in the charging station, including all of the factors of charge rate, temperature and specific gravity to derive a measure of charge introduced and pack condition. In the preferred embodiment the invention would download a report on pack history and condition to the external computer at the charging station, which could forward this information to the central computer, which could then accumulate this data and make historical comparisons to determine when a pack should be removed from service and recycled. If a computer decides, based upon this downloaded information, that the pack has reached the end of its useful life, or requires maintenance, it may notify the user with the bill by mail or by some communications device at the charging station (see discussion of FIG. 5, below).

As discussed above in connection with the interconnection between the vehicle and the invention, the charging station will verify the user ID when the pack is first plugged into the charging station. This would be most likely when the pack is removed from the vehicle in a swapping environment. Alternatively, the station will periodically interrogate the invention to confirm that the ID information has not changed (i.e., if a valid user has been unplugged and a "bootleg" user is attempting to charge his vehicle on the first user's account)—more likely if the pack remains in the vehicle, and the charging station is an unattended post in a parking lot as described in FIG. 5).

This time in the charging station could also be used by the central computer to upload new programming into the invention. In one embodiment of the invention, historical data about the type of battery pack used could be periodically loaded into the invention while it is plugged into the charging station, based upon the nationwide experience with other packs of its kind. This sort of information will be gathered almost as a by-product of the normal functioning of the invention as it is implemented in enough packs to provide a valid statistical base, and would allow the invention, with suitable programming obvious to one skilled in the art, to make even more accurate estimates of pack capacity and life.

Figure 5:
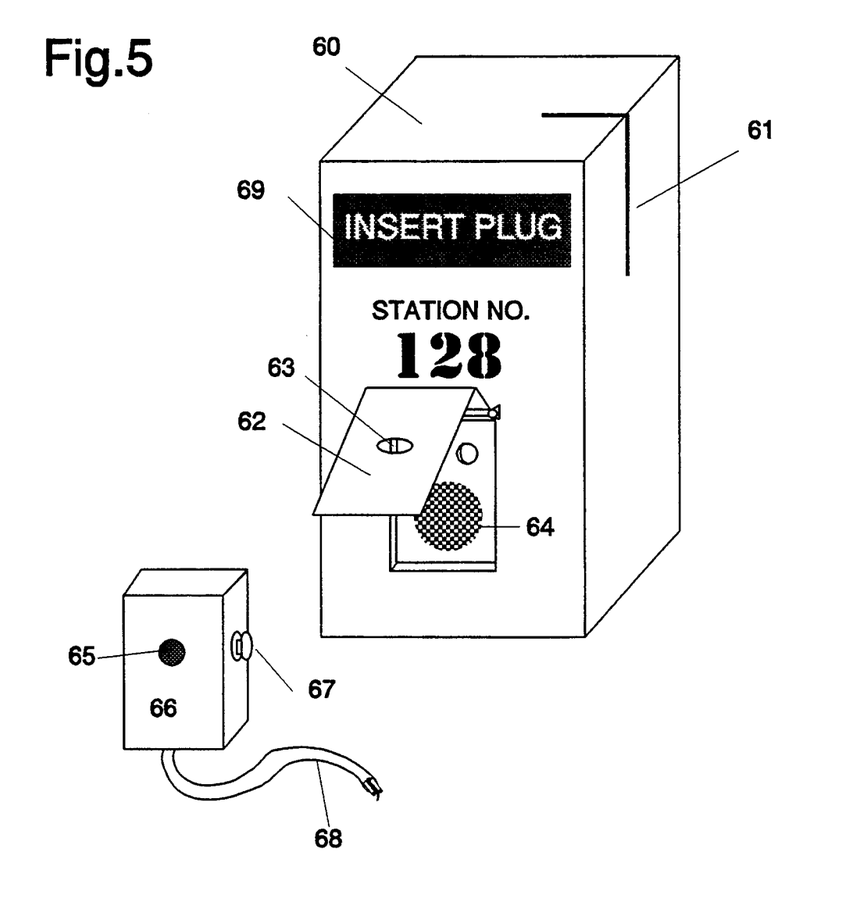
FIG. 5 shows a charging station usable with the preferred embodiment of the invention.

FIG. 5 shows details of a charging station for use with the invention. The station of FIG. 5 (60) is shown as it might be set up to be mounted on a post or to the wall in a parking lot, with one station located in a number of the stalls in the lot. A battery charger of any conventional design would be built into the charging station, controlled by the local computer as detailed above in FIG. 4. Alternatively, a source of battery charging current could be centrally located, and simply metered and controlled by circuitry in the charging station.

The charging station (60) would be connected to a central computer, perhaps through a local concentrator or multiplexor. Alternatively, there might be one main computer in the parking lot/charging service station which communicates with the central computer, and the charging stations themselves would be no more than terminals operating off the main computer. The data communications between the charging stations and the main local computer or concentrator could be by any convenient means of networking, from "daisy chains" of dedicated cables, individual wiring, or even "piggybacking" a signal on the power supply leads to the chargers using a carrier current.

The charging station (60) has a socket (64) adapted to mate with the plug (66), connected by its wire (68) to the system of the invention. As noted above, this plug will vary based upon the standard which will evolve in the industry.

In a preferred embodiment of the charging station, the socket (64) will have a means for locking the plug (66) into the station. In FIG. 5, this is shown as a flap (62) which will close over the plug (66) when it is inserted. A pin (65) on the plug (66) is extended by a key (67), locking the plug in the socket, so that the vehicle may be left unattended without fear of being unplugged or tampered with. It will be understood that there are many other ways of locking a plug in a socket which may be used within the teachings of the invention.

The charging station may have a display panel (69) for communicating with the user. The display panel (69) will lead the user through inserting the plug into the station, beginning the charge cycle, etc. It may display messages as to the status of the transaction ("CHARGING", "CHARGE COMPLETE", etc.) and as to the credit status of the account ("CHARGE DENIED"). The display panel can also display messages from the central computer to the vehicle user such as "PACK PROBLEMS—CALL SERVICE", or warn the user when pack life is used up.

If desired, the charging station (60) can optionally include a standard credit-card swipe slot (61), as used in the common credit-card verifier terminals, so that a vehicle user can pay for his charge by credit-card if he has not made arrangements for centralized automatic billing.

Accordingly, it is to be understood that the embodiments of the invention herein described are merely illustrative of the application of the principles of the invention. Reference herein to details of the illustrated embodiments are not intended to limit the scope of the claims, which themselves recite those features regarded as essential to the invention.

I claim:

1. A battery pack monitoring device permanently attached to a battery pack which battery pack is a replaceable pack in a battery-using installation, such that when the battery pack in the installation is exhausted, the entire battery pack may be replaced with a new pack having a battery pack monitoring device, and the replaceable pack is recharged external of the battery-using installation, the battery pack comprising a plurality of batteries, each battery comprising a plurality of cells, the device comprising:

a) a plurality of sensor means for collecting information on at least one of the cells, each of the sensors having inputs for monitoring a parameter of the cell,
   b) a plurality of data output means for communicating data about the battery pack, and
   c) computer means for processing and storing data, comprising:
      i) a plurality of input port means for accepting data connected to the plurality of sensors,
      ii) a plurality of output port means for transmitting data connected to the plurality of data output means,
      iii) a plurality of data input/output means for communicating with an external data processing means for collecting data, one of the data input/output means receives identification indicia from the battery-using installation, such that the installation is identified to the battery monitoring device,
      iv) nonvolatile memory means for storing instructions and data, and
      v) programmable processor means for processing data connected to the input port means, output port means, data input/output means, and memory means, in which data about the battery pack collected through the sensors is accepted by the computer means through the input port means and is processed by the programmable processor means based upon instructions stored in the memory means and is accumulated as processed data, the processed data being stored in the memory means and the processed data and the identification indicia of the battery-using installation is communicated to the external data processing means through the data input/output means.

2. The battery pack monitoring device of claim 1 in which the installation is an electric vehicle, and the battery pack is a replaceable traction battery pack for an electric vehicle.

3. The battery pack monitoring device of claim 2 in which at least one of the output port means of the computer means provides "fuel gauge" type information on remaining charge in the battery pack to the vehicle driver.

4. The battery pack monitoring device of claim 1 in which the external data processing means is a computer operating a billing system, whereby information on the use of the battery pack is collected by the battery monitoring device, is stored in the memory means, and is transmitted on demand through the data input/output means for the purpose of billing for the use of the battery pack.

5. The battery pack monitoring device of claim 1 in which the parameter being measured by at least one of the sensors is the voltage of at least one of the cells or batteries in the battery pack.

6. The battery pack monitoring device of claim 1 in which the parameter being measured by at least one of the sensors is the current flow through the battery pack.

7. The battery pack monitoring device of claim 1 in which the parameter being measured by at least one of the sensors is the specific gravity of the electrolyte in at least one of the cells in the battery pack.

8. The battery pack monitoring device of claim 1 in which the parameter being measured by at least one of the sensors is the temperature of at least one of the cells in the battery pack.

9. The battery pack monitoring device of claim 1 in which the parameter being measured by at least one of the sensors is the ambient temperature around at least one of the cells or batteries in the battery pack.

10. The method of monitoring the condition of a replaceable battery pack in which the battery pack is a replaceable pack in a battery-using installation, such that when the battery pack in the installation is exhausted, the entire battery pack may be replaced with a new pack having a battery pack monitoring device, and the replaceable pack is recharged external of the battery-using installation, comprising a plurality of batteries, each battery comprising a plurality of cells, comprising the steps of:
   a) accumulating information about the pack through a plurality of sensors on at least one of the cells, each of the sensors having inputs for measuring a parameter of the cell,
   b) processing the information through a computer permanently attached to the battery pack and connected to the sensors,
   c) accumulating the processed information in nonvolatile memory means for storing programs and information,
   d) interrogating the battery-using installation and receiving identification indicia which identifies the battery-using installation to the battery monitoring device,
   e) communicating the accumulated information to an external data processing means for collecting data, the information communicated to the external data processing means including the identification indicia of the battery-using installation using the pack.

11. The method of claim 10 in which the battery-using installation is an electric vehicle, and the battery pack is a replaceable traction battery pack for an electric vehicle.

12. The method of claim 11 further comprising the step of communicating "fuel gauge" type data on the remaining range in the pack to the driver of the vehicle.

13. The method of claim 11 wherein the data processing means is a system for billing users of the battery pack, further comprising the step of billing the vehicle owner for the usage of the battery pack based on the information transmitted.

14. The method of claim 13 further comprising the step of verifying the vehicle identification indicia by means of a data base of valid users which is part of the external data-processing means.

15. The battery pack monitoring device of claim 1, further comprising a battery charging station, comprising:
   a) a battery charger, having a charge output for charging storage batteries and a control input for enabling or disabling the charging output,
   b) computer means for controlling the charging station and communicating data, comprising:
      i) a control output connected to the control input of the battery charger,
      ii) a plurality of data input means for accepting data about the battery pack, communicating with the data input/output means of the battery pack monitoring device, and
      iii) communication port means for communicating data with an external computer,
   c) socket means for connecting to and intercommunicating with the battery monitoring device and with the battery pack, such that the charge output of the battery charger of the battery charging station may be connected to the battery pack, and the data input/output means of the battery monitoring device may be connected to the data input means of the computer means of the charging station, and
   d) telecommunication means for communicating with a remote computer having data base means for storing information, connected to the communication port means of the computer means.

16. The battery pack monitoring device of claim 15 in which the computer means of the charging station operates by the steps of:
   a) interrogating the computer means of the monitoring device through the data input/output means,
   b) receiving the installation identification data from the computer means of the monitoring device,
   c) communicating the identification data to the remote computer through the communications port means and telecommunications means,
   d) receiving authorization to charge from the remote computer,
   e) activating the battery charger through the control output of the computer connected to the control input of the battery charger.

17. The battery pack monitoring device of claim 16 in which the method of operation of the computer means of the charging station further comprises the steps of:
   a) downloading the information about the battery pack from the nonvolatile memory means of the computer means of the battery pack monitoring device,
   b) communicating the battery pack information to the remote computer through the communications port means and telecommunications means.

18. The battery pack monitoring device of claim 17 in which the method of operation of the computer means of the charging station further comprises the step of billing the use of the pack based on the information communicated from the charging station.

19. The battery pack monitoring device of claim 15, in which the charging station further comprises display means for communicating information to the user of the charging station.

20. The battery pack monitoring device of claim 15, in which the charging station of claim 15 further comprises card swipe means for reading credit card identification data from a credit card having a magnetic stripe.

21. The battery pack monitoring device of claim 15, in which the socket means of the charging station further comprises lock means for keeping the battery monitoring device and the charging station connected, so that the installation may not be unplugged from the charging station without unlocking the locking means.

* * * * *